United States Patent
Park

(10) Patent No.: US 9,569,358 B2
(45) Date of Patent: Feb. 14, 2017

(54) ELECTRONIC DEVICE AND METHOD FOR FABRICATING THE SAME

(71) Applicant: SK hynix Inc., Icheon-Si (KR)

(72) Inventor: Gil-Jae Park, Icheon-Si (KR)

(73) Assignee: SK hynix Inc., Icheon-Si (KR)

(*) Notice: Subject to any disclaimer, the term of this patent is extended or adjusted under 35 U.S.C. 154(b) by 20 days.

(21) Appl. No.: 14/588,859

(22) Filed: Jan. 2, 2015

(65) Prior Publication Data
US 2016/0071905 A1 Mar. 10, 2016

(30) Foreign Application Priority Data
Sep. 5, 2014 (KR) .................. 10-2014-0119201

(51) Int. Cl.
| | |
|---|---|
| *H01L 43/08* | (2006.01) |
| *H01L 43/02* | (2006.01) |
| *H01L 27/22* | (2006.01) |
| *G06F 3/06* | (2006.01) |
| *G06F 12/08* | (2016.01) |

(52) U.S. Cl.
CPC ............ *G06F 12/0802* (2013.01); *G06F 3/061* (2013.01); *G06F 3/0647* (2013.01); *G06F 3/0679* (2013.01); *H01L 27/228* (2013.01); *H01L 43/08* (2013.01); *G06F 2212/1016* (2013.01); *G06F 2212/2024* (2013.01)

(58) Field of Classification Search
CPC ........ H01L 43/08; H01L 43/02; H01L 27/222; G06F 12/0868; G06F 17/5068; G06F 2212/1024; G06F 2212/202; G06F 2212/313; G06F 12/0802; G06F 3/0679; G06F 3/061; G06F 2212/1016; G06F 2212/2024; G06F 3/0647
See application file for complete search history.

(56) References Cited

U.S. PATENT DOCUMENTS

| | | | | |
|---|---|---|---|---|
| 2008/0258129 | A1* | 10/2008 | Toda | G11C 11/56 257/5 |
| 2010/0090261 | A1* | 4/2010 | Zheng | G11C 11/16 257/295 |
| 2013/0051133 | A1 | 2/2013 | Son et al. | |
| 2014/0219014 | A1* | 8/2014 | Lee | G11C 11/56 365/163 |
| 2014/0258597 | A1* | 9/2014 | Kim | G11C 11/5642 711/103 |
| 2015/0063020 | A1* | 3/2015 | Kajigaya | G11C 11/1675 365/158 |

* cited by examiner

*Primary Examiner* — Hashem Farrokh
(74) *Attorney, Agent, or Firm* — Perkins Coie LLP

(57) ABSTRACT

An electronic device including a semiconductor memory that includes: a selection element; a first plug and a second plug that are coupled with two different sides of the selection element, respectively; a variable resistance element formed over the first plug and configured to store data; and a dummy variable resistance element formed over the second plug and configured to include a conductive path coupled with the second plug.

19 Claims, 13 Drawing Sheets

ELECTRONIC DEVICE AND METHOD FOR FABRICATING THE SAME

CROSS-REFERENCE TO RELATED APPLICATIONS

This patent document claims priority and benefits of Korean Patent Application No. 10-2014-0119201, entitled "ELECTRONIC DEVICE AND METHOD FOR FABRICATING THE SAME" and filed on Sep. 5, 2014, which is incorporated herein by reference in its entirety.

BACKGROUND

This patent document relates to memory circuits or devices and their applications in electronic devices or system.

Recently, as electronic devices or appliances trend toward miniaturization, low power consumption, high performance, multi-functionality, and so on, there is a demand for semiconductor devices capable of storing information in various electronic devices or appliances such as a computer, a portable communication device, and so on, and research and development for such electronic devices have been conducted. Examples of such semiconductor devices include semiconductor devices which can store data using a characteristic that they are switched between different resistance states according to an applied voltage or current, for example, an RRAM (resistive random access memory), a PRAM (phase change random access memory), an FRAM (ferroelectric random access memory), an MRAM (magnetic random access memory), an E-fuse, etc.

SUMMARY

The disclosed technology in this patent document includes memory circuits or devices and their applications in electronic devices or systems and various implementations of an electronic device and a method for fabricating the same. The disclosed technology can be implemented to, among others, improve the product reliability.

In one aspect, an electronic device is provide to comprise a semiconductor memory that comprises: a selection element; a first plug and a second plug that are coupled with two different sides of the selection element, respectively; a variable resistance element formed over the first plug and configured to store data; and a dummy variable resistance element formed over the second plug and configured to include a conductive path coupled with the second plug.

In some implementations, the line width or volume of the first plug may be the same as or greater than the line width or volume of the second plug. In some implementations, the first plug and the second plug may have the same height. In some implementations, the magnetic tunnel junction and the dummy magnetic tunnel junction may be formed on the same plane and have the same size. In some implementations, the variable resistance element and the dummy variable resistance element may include a magnetic tunnel junction in which a tunnel barrier is interposed between two magnetic materials, and the tunnel barrier of the dummy magnetic tunnel junction is dielectrically broken down. In some implementations, the variable resistance element may include a metal oxide dielectric material, a phase-change dielectric material, or a ferroelectric dielectric material, and the dummy variable resistance element may include a metal oxide dielectric material, a phase-change dielectric material, or a ferroelectric dielectric material that is dielectrically broken down.

In some implementations, the semiconductor memory may further comprises: a third plug formed over the variable resistance element; a fourth plug formed over the dummy variable resistance element and coupled with the conductive path; a first conductive line coupled with the third plug; and a second conductive line coupled with the fourth plug. In some implementations, a line width or volume of the third plug may be the same as or greater than the line width or volume of the fourth plug. In some implementations, the third plug and the fourth plug may have the same height.

In some implementations, the electronic device may further comprise a microprocessor which includes: a control unit configured to receive a signal including a command from an outside of the microprocessor, and performs extracting, decoding of the command, or controlling input or output of a signal of the microprocessor; an operation unit configured to perform an operation based on a result that the control unit decodes the command; and a memory unit configured to store data for performing the operation, data corresponding to a result of performing the operation, or an address of data for which the operation is performed, wherein the semiconductor memory is part of the memory unit in the microprocessor.

In some implementations, the electronic device may further comprise a processor which includes: a core unit configured to perform, based on a command inputted from an outside of the processor, an operation corresponding to the command, by using data; a cache memory unit configured to store data for performing the operation, data corresponding to a result of performing the operation, or an address of data for which the operation is performed; and a bus interface connected between the core unit and the cache memory unit, and configured to transmit data between the core unit and the cache memory unit, wherein the semiconductor memory is part of the cache memory unit in the processor.

In some implementations, the electronic device may further comprise a processing system which includes: a processor configured to decode a command received by the processor and control an operation for information based on a result of decoding the command; an auxiliary memory device configured to store a program for decoding the command and the information; a main memory device configured to call and store the program and the information from the auxiliary memory device such that the processor can perform the operation using the program and the information when executing the program; and an interface device configured to perform communication between at least one of the processor, the auxiliary memory device and the main memory device and the outside, wherein the semiconductor memory is part of the auxiliary memory device or the main memory device in the processing system.

In some implementations, the electronic device may further comprise a data storage system which includes: a storage device configured to store data and conserve stored data regardless of power supply; a controller configured to control input and output of data to and from the storage device according to a command inputted form an outside; a temporary storage device configured to temporarily store data exchanged between the storage device and the outside; and an interface configured to perform communication between at least one of the storage device, the controller and the temporary storage device and the outside, wherein the semiconductor memory is part of the storage device or the temporary storage device in the data storage system.

In some implementations, the electronic device may further comprise a memory system which includes: a memory configured to store data and conserve stored data regardless of power supply; a memory controller configured to control input and output of data to and from the memory according to a command inputted form an outside; a buffer memory configured to buffer data exchanged between the memory and the outside; and an interface configured to perform communication between at least one of the memory, the memory controller and the buffer memory and the outside, wherein the semiconductor memory is part of the memory or the buffer memory in the memory system.

In another aspect, an electronic device is provided to include a semiconductor memory. This semiconductor memory includes a substrate; memory cells formed over the substrate as a memory cell array for storing data; and selection elements coupled to the memory cells, respectively, each selection element operable to turn on or off a corresponding coupled memory cell. Each memory cell includes a variable resistance element formed over the substrate to exhibit different resistance states that represent different digital bits for store data; a dummy variable resistance element formed over the substrate to have a similar structure as the variable resistance element and located adjacent to the variable resistance element, the dummy variable resistance including a conductive path passing through the dummy variable resistance element and does not exhibit different resistance states; first and second plugs formed over the substrate and respectively coupled to the variable resistance element and the dummy variable resistance element, respectively; and a selection element formed over the substrate and having two terminals coupled to the first and second plugs, respectively. The selection element is operable to switch on or off a variable resistance element inside a corresponding memory cell.

In yet another aspect, a method for fabricating an electronic device is provided. The method comprises: preparing a substrate including selection elements; forming a first inter-layer dielectric layer over the substrate; forming first plugs and second plugs that are coupled with different sides of the selection elements by penetrating through the first inter-layer dielectric layer; forming magnetic tunnel junctions including a tunnel barrier interposed between two magnetic materials over the first inter-layer dielectric layer, the magnetic tunnel junctions contact the first plugs and the second plugs; forming a second inter-layer dielectric layer covering the magnetic tunnel junctions over the first inter-layer dielectric layer; forming third plugs and fourth plugs in the second inter-layer dielectric layer such that the third plugs are coupled with the magnetic tunnel junctions that are coupled with the first plugs and that fourth plugs are coupled with the magnetic tunnel junctions that are coupled with the second plugs; forming first conductive lines and second conductive lines that are coupled with the third plugs and the fourth plugs, respectively, over the second inter-layer dielectric layer; and forming dummy magnetic tunnel junctions by applying a forming voltage to the second conductive lines to cause dielectric breakdown of tunnel barriers of the magnetic tunnel junctions that are coupled with the second conductive lines.

In some implementations, the forming of the dummy magnetic tunnel junctions may include applying the forming voltage including a plurality of intermittent forming sections. In some implementations, each forming section may have a predetermined section length, or the section lengths of the forming sections gradually increase as the number of forming sections previously included before the corresponding forming sections increases. In some implementations, the line width or volume of the first plugs may be the same as or greater than the line width or volume of the second plugs. In some implementations, the forming of the plurality of the magnetic tunnel junctions may includes: forming a stacked layer where a tunnel barrier is interposed between two magnetic materials over the first inter-layer dielectric layer; and simultaneously forming the plurality of the magnetic tunnel junctions that contact the first plugs and the second plugs over the stacked layer by using a mask pattern as an etch barrier and etching the stacked layer. In some implementations, the line width or volume of the third plugs may be the same as or greater than the line width or volume of the fourth plugs. In some implementations, the forming of the dummy magnetic tunnel junctions may include applying a first forming voltage and a second forming voltage that have a potential level difference from each other to the substrate and the second conductive lines, respectively. In some implementations, the first forming voltage ranges from a back bias voltage to a ground voltage, and the second forming voltage ranges from a power source voltage to a pumping voltage. In some implementations, the first forming voltage may be continuously applied to the substrate, and the second forming voltage having a plurality of intermittent forming sections may be applied to the second conductive lines. In some implementations, each of the plurality of the intermittent forming sections may have a predetermined section length, or the section lengths of the intermittent forming sections gradually may increase as the number of the intermittent forming sections previously included before the corresponding forming sections increases.

In some implementations, the dummy magnetic tunnel junction electrically connects the second plug with the fourth plug.

Those and other aspects of the disclosed technology and their implementations and variations are described in greater detail in the drawings, the description and the claims.

DETAILED DESCRIPTION

Figure 1:
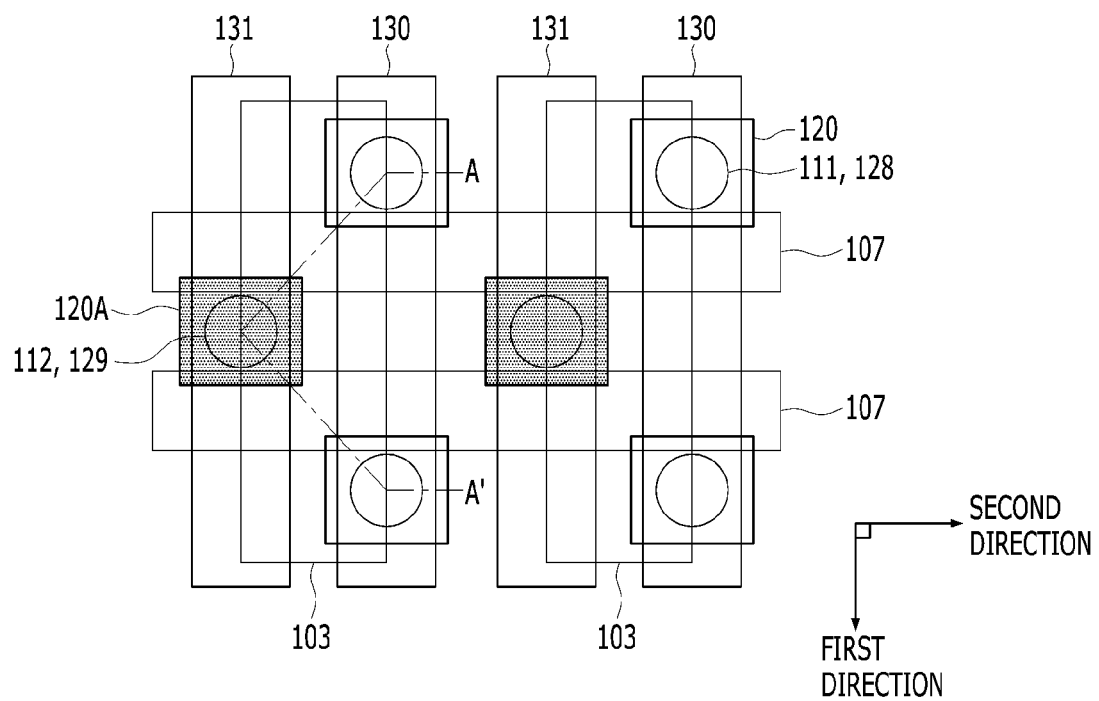
FIG. 1 is a plan view illustrating a semiconductor memory in accordance with an implementation of the disclosed technology.

Various examples and implementations of the disclosed technology are described below in detail with reference to the accompanying drawings. The drawings may not be necessarily to scale and in some instances, proportions of at least some of structures in the drawings may have been exaggerated in order to clearly illustrate certain features of the described examples or implementations. In presenting a specific example in a drawing or description having two or more layers in a multi-layer structure, the relative positioning relationship of such layers or the sequence of arranging the layers as shown reflects a particular implementation for the described or illustrated example and a different relative positioning relationship or sequence of arranging the layers may be possible. In addition, a described or illustrated example of a multi-layer structure may not reflect all layers present in that particular multi-layer structure (e.g., one or more additional layers may be present between two illustrated layers). As a specific example, when a first layer in a described or illustrated multi-layer structure is referred to as being "on" or "over" a second layer or "on" or "over" a substrate, the first layer may be directly formed on the second layer or the substrate but may also represent a structure where one or more other intermediate layers may exist between the first layer and the second layer or the substrate.

The following implementations of the present patent document relate to an electronic device including a semiconductor memory with improved reliability, and a method for fabricating the semiconductor memory. Herein, the semiconductor memory in accordance with the implementations of the patent document is described by taking an example where a variable resistance element is used as a storage element. The variable resistance element is a device that may switch between different resistance states in response to a bias, e.g., current or voltage, applied thereto. The variable resistance element may include a variable resistance material used for a resistive memory in which a data is programmed or erased based on a change in its resistance characteristics. The variable resistance material may include diverse materials that are used for a RRAM (Resistive Random Access Memory), a PRAM (Phase Change Random Access Memory), an FRAM (Ferroelectric Random Access Memory), an MRAM (Magnetic Random Access Memory), an STTRAM (Spin Transfer Torque Random Access Memory), etc. For example, the variable resistance material may include a ferromagnetic material, a transition metal oxide dielectric material, a metal oxide dielectric material including a perovskite-based material, a phase-change dielectric material, or a ferroelectric dielectric material.

In the following implementation of the disclosed technology, a Magnetic Tunnel Junction (MTJ) including a tunnel barrier between two magnetic materials is taken and described as an example of the variable resistance element. This example is presented for the sake of convenience in description, and the variable resistance element that may be applied to the disclosed technology is not limited to the magnetic tunnel junction.

Figure 2:
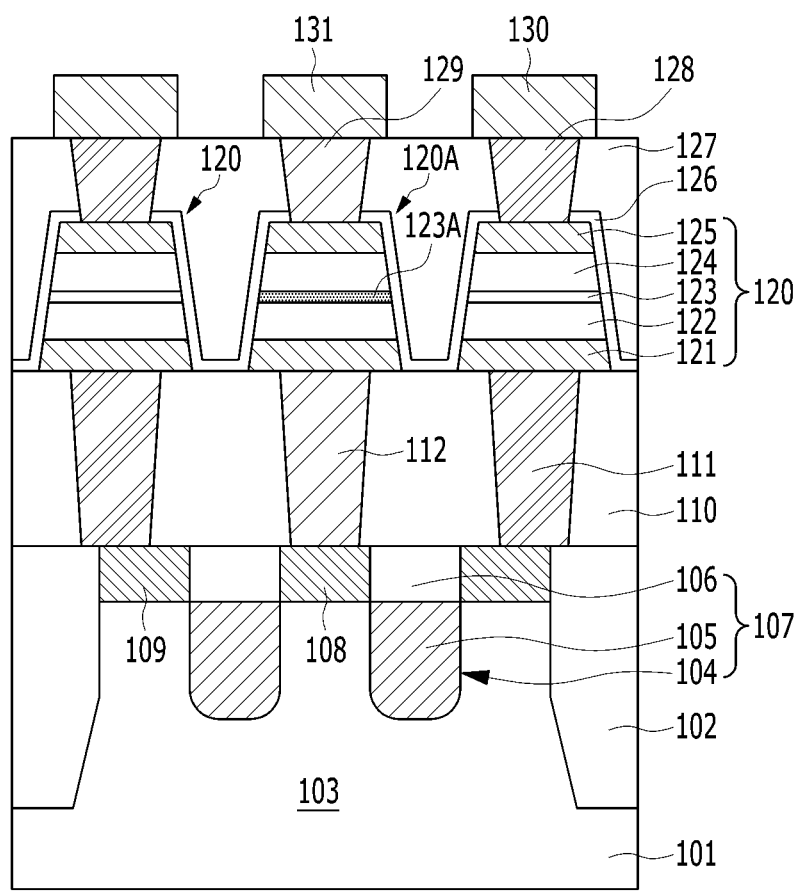
FIG. 2 is a cross-sectional view illustrating the semiconductor memory in FIG. 1.

FIG. 1 is a plan view illustrating a semiconductor memory in accordance with an implementation of the disclosed technology. FIG. 2 is a cross-sectional view illustrating the semiconductor memory in FIG. 1.

Referring to FIGS. 1 and 2, the semiconductor memory in accordance with one implementation of the disclosed technology may include a selection element, a first plug 111 and a second plug 112 that are respectively disposed different sides, for example, on one side and the other side of the selection element, a variable resistance element formed over the first plug 111, and a dummy variable resistance element formed over the second plug 112 and having a conductive path that is electrically connected to the second plug 112. Herein, the variable resistance element may be, or include, a magnetic tunnel junction 120, and the dummy variable resistance element having the conductive path may be or include a dummy magnetic tunnel junction 120A including a tunnel barrier 123A that is dielectrically broken down. In other implementations of the disclosed technology, the variable resistance element may include a metal oxide dielectric material, a phase-change dielectric material, or a ferroelectric dielectric material, and the dummy variable resistance element may include a metal oxide dielectric material, a phase-change dielectric material, or a ferroelectric dielectric material that is dielectrically broken down.

The semiconductor memory in accordance with one implementation of the disclosed technology may further include a first conductive line 130, a third plug 128 coupling the first conductive line 130 with the variable resistance element, a second conductive line 131, and a fourth plug 129 coupling the second conductive line 131 with the dummy variable resistance element. Herein, the conductive path inside of the dummy variable resistance element is electrically connected to the fourth plug 129. The first conductive line 130 may be or include a bit line, and the second conductive line 131 may be or include a source line. The second plug 112, the dummy magnetic tunnel junction 120A, and the fourth plug 129 may function as a source line contact SLC that electrically connects the selection element with the source line SL.

Hereafter, the constituent elements of the semiconductor memory in accordance with the implementation of the present disclosure are described in detail.

The semiconductor memory in accordance with one implementation of the present disclosure may include a substrate 101, an isolation layer 102 that is formed over the substrate 101 and defines a plurality of active regions 103, a plurality of buried gates 107 formed over the substrate 101, junction regions, for example, a source region 108 and a drain region 109, formed in the substrate 101 of the active regions 103 on both sides of each of the buried gates 107. Although not illustrated in the drawings, the semiconductor memory may further include a well region formed in the substrate 101. The well region may be or include an impurity region formed by doping the substrate 101 with an impurity, and the active regions 103 may be disposed in the well region. The well region may be used as a means for applying a predetermined bias.

The substrate 101 may be or include a semiconductor substrate. The semiconductor substrate may be or include a monocrystalline state, and it may include a silicon-containing material. For example, the semiconductor substrate may include a monocrystalline silicon-containing material. For example, the substrate may be or include a bulk silicon substrate, or a Silicon On Insulator (SOI) substrate where a support substrate, a buried dielectric layer, and a monocrystalline silicon layer are stacked.

The isolation layer 102 that defines the active regions 103 may be formed through, for example, a Shallow Trench Isolation (STI) process. Therefore, the isolation layer 102 may include isolation trenches formed in the substrate 101 and a dielectric layer that gap-fills the isolation trenches. The dielectric layer may include one or more layers including an oxide layer, a nitride layer, or an oxynitride layer. The active regions 103 defined by the isolation layer 102 may be or include a bar type or a line type having a long axis in a first direction and a short axis in a second direction. Each of the active regions 103 may be extended in the first direction, and the active regions 103 may be disposed to be spaced apart from each other by a predetermined gap in the second direction.

The buried gates 107 formed in the substrate 101 and the source region 108 and the drain region 109 that are formed in the substrate 101 of the active regions 103 on both sides of each of the buried gates 107 function as a buried transistor. The buried transistor may function as the selection element that selects one magnetic tunnel junction 120 among the magnetic tunnel junctions 120. The source region 108 and the drain region 109 may be impurity regions formed by doping the substrate 101 with an impurity. The drain region 109 may be disposed between the isolation layer 102 and the buried gates 107, and the source region 108 may be disposed between two buried gates 107. Therefore, the source region 108 may be shared by two buried transistors.

The buried gates 107 may function as gates and word lines of the buried transistors. In one implementation, the buried gates 107 may be of a line type crossing the active regions 103 and the isolation layer 102. For example, the buried gates 107 may be of a line-type pattern where the lines are extended in the second direction, and the buried gates 107 may be disposed to be spaced apart from each other by a predetermined gap in the first direction. Each of the buried gates 107 may include a trench 104 formed in the substrate 101, a gate dielectric layer (not shown) formed on the surface of the trench 104, a gate electrode 105 gap-filling a portion of the trench 104 over the gate dielectric layer (not shown), and a gate sealing layer 106 gap-filling the remaining portion of the trench 104 over the gate electrode 105.

Although a transistor including a buried gate 107 is described as the selection element in the implementation of the disclosed technology, the selection element can be implemented by other devices capable of controlling the supply of a current or voltage to the magnetic tunnel junction 120, such as a diode, a Metal Insulator Transition (MIT) o.

The semiconductor memory in accordance with the implementation of the present disclosure may include a first inter-layer dielectric layer 110 formed over the profile of the substrate 101, and the first plug 111 and the second plug 112 that penetrating through the first inter-layer dielectric layer 110 to be coupled with the drain region 109 and the source region 108, respectively. The first inter-layer dielectric layer 110 may be a single layer including an oxide layer, a nitride layer, or oxynitride layer, or a multi-layer of two or more of them.

The first plug 111 and the second plug 112 may be simultaneously formed, and they may have the same height. The first plug 111 may couple the drain region 109 with the magnetic tunnel junction 120, while the second plug 112 may couple the source region 108 with the dummy magnetic tunnel junction 120A. The first plug 111 may be referred to as a bottom contact or a Bottom Electrode Contact (BEC), and the second plug 112 may function as a part of the Source Line Contact (SLC).

A first plug 111 and a second plug 112 may be disposed in a zigzag shape in the first direction and the second direction. For example, the first plugs 111 may be disposed to be eccentric to one side of the active regions 103 in the second direction. The second plugs 112 may be disposed to be eccentric to the other side of the active regions 103. The first plugs 111 and the second plugs 112 may be disposed to be eccentric to one side and the other side of the active regions 103, respectively, and to contact both of the active regions 103 and the isolation layer 102. Also, the first plugs 111 and the second plugs 112 may be alternately disposed in the first direction or in an oblique direction at a predetermined angle from the second direction. This is to secure the gap between the first conductive line 130 and the second conductive line 131 while securing the gap between the magnetic tunnel junction 120 and the dummy magnetic tunnel junctions 120A.

The size of the first plugs 111 including the line width or volume may be the same as or greater than the second plugs 112. When the size of the first plugs 111 including the line width or volume is greater than the second plugs 112, the operation characteristics of the semiconductor memory can be improved. This is because the semiconductor memory including a variable resistance element reacts more sensitively to the resistance value of the first plug 111 coupled with the magnetic tunnel junction 120 that function as a storage element than the resistance value of the second plug 112 that functions as a part of the source line contact (SLC). Thus, as the line width or volume of the first plugs 111 is formed greater than the line width or volume of the second plugs 112 within a limited space, the operation characteristics of the semiconductor memory sensing a change in resistance can be improved.

The semiconductor memory in accordance with implementations of the patent document may include the magnetic tunnel junction 120 formed over the first inter-layer dielectric layer 110 to contact the first plug 111, the dummy magnetic tunnel junction 120A formed over the first inter-layer dielectric layer 110 to contact the second plug 112, and a capping layer 126 formed over the surface of the substrate structure including the magnetic tunnel junction 120 and the dummy magnetic tunnel junction 120A.

The magnetic tunnel junction 120 coupled with the first plug 111 may function as a storage element. The magnetic tunnel junction 120 may be or include a stacked structure where a bottom electrode 121, a first magnetic material 122, a tunnel barrier 123, a second magnetic material 124, and a top electrode 125 are sequentially stacked. In one implementation, the bottom electrode 121 and the top electrode 125 may be replaced by the first plug 111 and the third plug 128. One of the first magnetic material 122 and the second magnetic material 124 may function as a pinned layer or a reference layer whose magnetization direction is fixed. The other one of the first magnetic material 122 and the second magnetic material 124 may function as a free layer or a storage layer whose magnetization direction is changed. The first magnetic material 122 and the second magnetic material 124 may be a single layer including an Fe—Pt alloy, an Fe—Pd alloy, a Co—Pd alloy, a Co—Pt alloy, an Fe—Ni—Pt alloy, a Co—Fe—Pt alloy, or a Co—Ni—Pt alloy, or a multi-layer of two or more of them. The tunnel barrier 123 changes the magnetization direction of the free layer with charges (e.g., electrons) tunneling therein. The tunnel barrier 123 may include a dielectric layer. For example, the tunnel barrier 123 may be a single layer of an oxide including MgO, MgON, $Al_2O_3$, CaO, SrO, TiO, VO, or NbO, or a multi-layer of two or more of them.

The dummy magnetic tunnel junction 120A may be simultaneously formed when the magnetic tunnel junction 120 is formed. Therefore, the dummy magnetic tunnel junction 120A may be disposed on the same plane and have the same size as the magnetic tunnel junction 120. The dummy magnetic tunnel junction 120A has the same constituent elements as the magnetic tunnel junction 120, but a tunnel barrier 123A of the dummy magnetic tunnel junction 120A may be dielectrically broken down. Therefore, the dummy magnetic tunnel junction 120A may not function as a storage element, but serves as a conductor for electrically connecting the second plug 112 and the fourth plug 129. The dummy magnetic tunnel junction 120A functions as a part of a source line contact (SLC). Herein, since the tunnel barrier 123 is thin enough so that it may be dielectrically broken down by applying a predetermined bias to both ends of the tunnel barrier 123. This will be described in detail later when describing a method for fabricating the semiconductor memory with reference to FIGS. 3F and 4F.

The capping layer 126 protects the magnetic tunnel junction 120 and the dummy magnetic tunnel junction 120A. The capping layer 126 may include a dielectric layer. The capping layer 126 may be a single layer including an oxide layer, a nitride layer, or an oxynitride layer, or a multi-layer of two or more of them.

The semiconductor memory in accordance with implementations of the patent document may include a second inter-layer dielectric layer 127 formed over the first inter-layer dielectric layer 110, the third plug 128 and the fourth plug 129 that are respectively coupled with the magnetic tunnel junction 120 and the dummy magnetic tunnel junction 120A through the second inter-layer dielectric layer 127 and the capping layer 126, and the first conductive line 130 and the second conductive line 131 that are formed over the second inter-layer dielectric layer 127 to respectively contact the third plug 128 and the fourth plug 129. The second inter-layer dielectric layer 127 may cover the substrate structure including the magnetic tunnel junction 120 and the dummy magnetic tunnel junction 120A. The second inter-layer dielectric layer 127 may be a single layer including an oxide layer, a nitride layer, or an oxynitride layer, or a multi-layer of two or more of them.

The third plug 128 may couple the first conductive line 130 and the magnetic tunnel junction 120, whereas the fourth plug 129 couple the second conductive line 131 and the dummy magnetic tunnel junction 120A. The third plug 128 may be referred to as a top contact or a Top Electrode Contact (TEC), and the fourth plug 129 may function as a part of the Source Line Contact (SLC). The third plug 128 may overlap with the first plug 111, and the fourth plug 129 may overlap with the second plug 112. Therefore, the third plug 128 and the fourth plug 129 may have the same disposition as the first plug 111 and the second plug 112.

The size of the third plug 128 including the line width or volume of the third plug 128 may be the same as or greater than the fourth plug 129. When the size of the third plug 128 including the line width or volume of the third plug 128 is greater than the fourth plug 129, the operation characteristics of the semiconductor memory sensing a change in resistance may be improved. In one implementation, the relationship between the size of the third plug 128 and the fourth plug 129 is the same as that between the first plug 111 and the second plug 112.

The third plug 128 and the fourth plug 129 may be simultaneously formed and have the same height. In this way, it is possible to protect the magnetic tunnel junction 120 from being damaged when the third plug 128 and the fourth plug 129 are formed. Herein, when the dummy magnetic tunnel junction 120A is not formed, the height of the third plug 128 becomes different from the height of the fourth plug 129. When the heights of the third plug 128 and the fourth plug 129 are different, the magnetic tunnel junction 120 is damaged during an etch process for forming the third plug 128 and the fourth plug 129, which is problematic.

The first conductive line 130 and the second conductive line 131 may be extended in the first direction, and disposed to be spaced apart from each other by a predetermined gap in the second direction. The first conductive line 130 and the second conductive line 131 may be alternately disposed in the second direction.

Hereafter, a method for fabricating the semiconductor memory shown in FIGS. 1 and 2 is described in accordance with an implementation of the disclosed technology with reference to FIGS. 3A to 3F and FIGS. 4A to 4F.

FIGS. 3A to 3F are plan views illustrating a method for fabricating the semiconductor memory in accordance with an implementation of the present disclosure. FIGS. 4A to 4F are cross-sectional views illustrating the semiconductor memory in accordance with the implementation of the present disclosure.

Figure 3A:
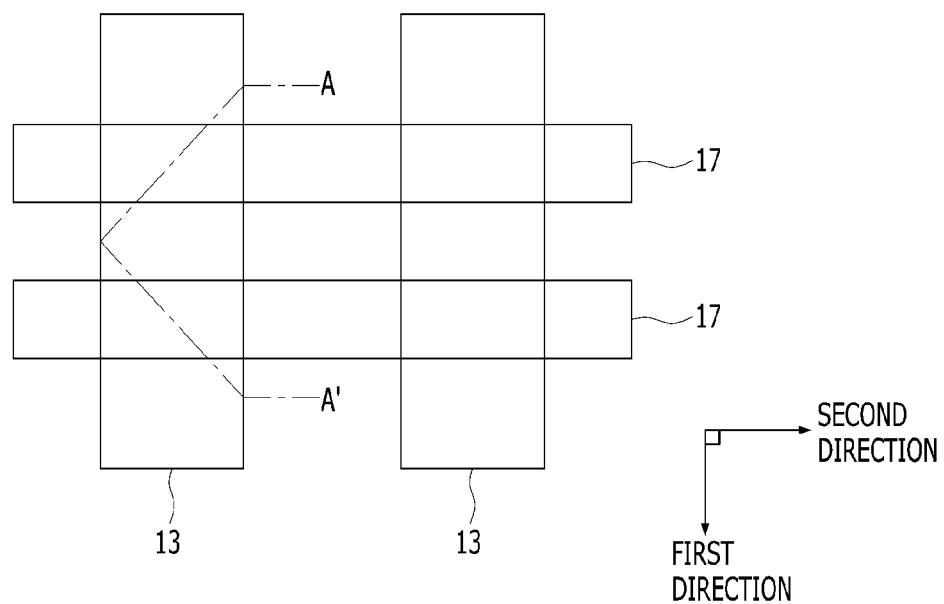
FIGS. 3A through 3F are plan views illustrating a method for fabricating the semiconductor memory in FIGS. 1 and 2.
Figure 4A:
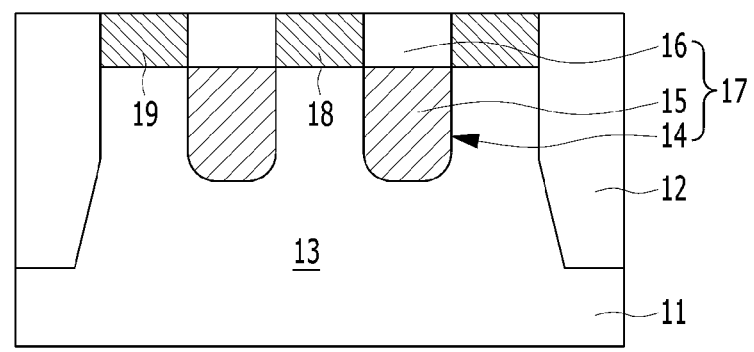
FIGS. 4A through 4F are cross-sectional views illustrating the method as shown in FIGS. 3A to 3F for fabricating the semiconductor memory in FIGS. 1 and 2.

Referring to FIGS. 3A and 4A, an isolation layer 12 defining a plurality of active regions 13 is formed in a substrate 11. The active regions 13 may be formed in a bar type or a line type extended in a first direction, and the active regions 13 may be disposed to be spaced apart from each other by a predetermined gap in a second direction.

The substrate 11 may be or include a semiconductor substrate. The substrate 11 may include a monocrystalline silicon-containing material. For example, the substrate 11 may be or include a bulk silicon substrate, or a Silicon On Insulator (SOI) substrate. The isolation layer 12 may be formed through, for example, a Shallow Trench Isolation (STI) process. The STI process includes a series of processes including selectively etching the substrate 11 to form isolation trenches and gap-filling the isolation trenches with a dielectric material.

Although not illustrated in the drawings, a well region may be formed in the substrate 11 before the isolation layer 12 is formed. The well region may be formed by doping the substrate 11 with an impurity.

Subsequently, a plurality of buried gates 17 that simultaneously go across the active regions 13 and the isolation layer 12 are formed in the substrate 11. The buried gates 17 may be formed in a line type extended in the second direction, and the buried gates 17 may be disposed to be spaced apart from each other by a predetermined gap in the first direction.

The buried gates 17 may function as selection elements, e.g., buried transistors and word lines. The buried gates 17 may be formed through a series of processes including forming trenches 14 by etching the substrate 11, forming a gate dielectric layer (not shown) on the surface of the trenches 14, forming gate electrodes 15 each of which gap-fills a portion of each of the trenches 14, and forming a gate sealing layer 16 that gap-fills the remaining portion of each of the trenches 14 over each gate electrode 15.

Subsequently, junction regions, for example, a source region 18 and a drain region 19, are formed by ion-implanting an impurity into the substrate 11 of the active regions 13 on both sides of each of the buried gates 17. Herein, the junction region formed between the isolation layer 12 and each buried gate 17 may function as the drain region 19, and the junction region formed between two buried gates 17 may function as the source region 18.

As a result, a buried transistor including the buried gate 17, the source region 18 and the drain region 19 may be formed. Meanwhile, in the process of forming the junction regions, a pick-up region (not shown) for applying a predetermined bias to the well region (not shown) formed in the substrate 11 may be formed.

Figure 3B:
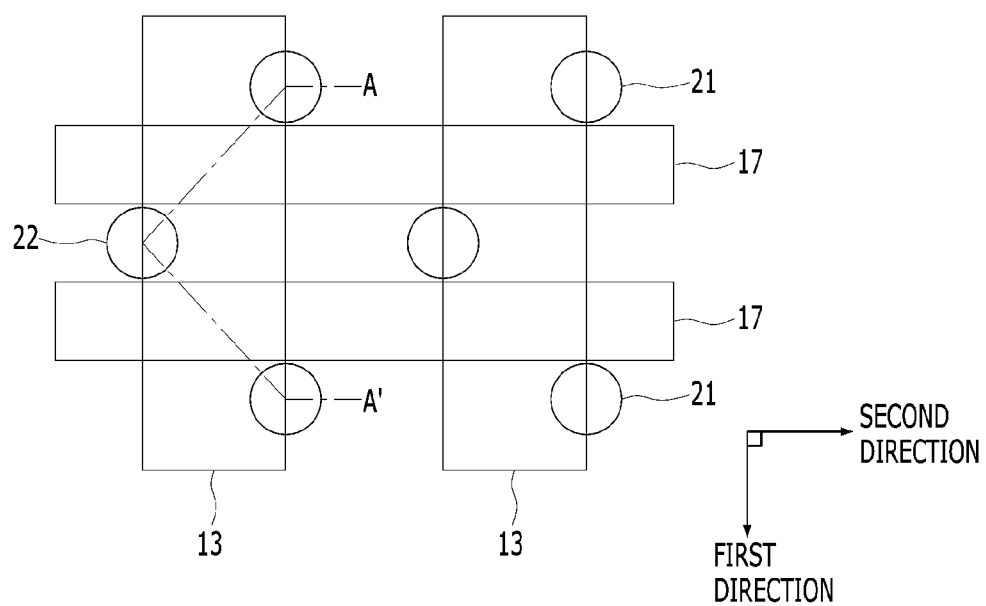
Figure 4B:
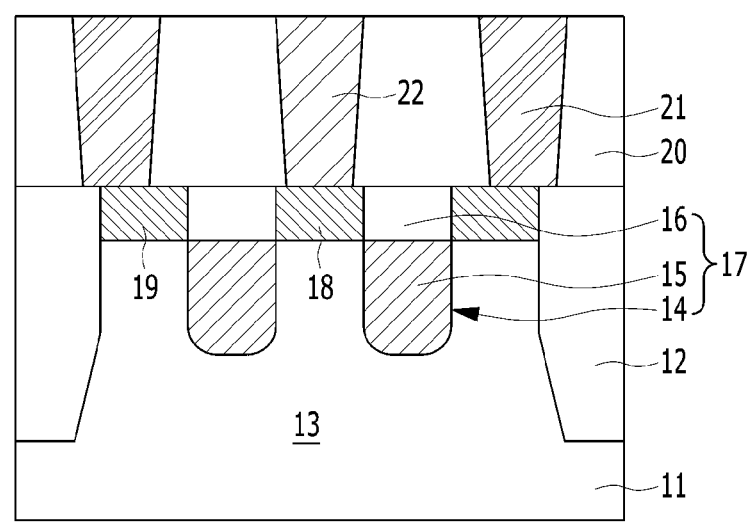

Referring to FIGS. 3B and 4B, a first inter-layer dielectric layer 20 is formed over the profile of the substrate 11. The first inter-layer dielectric layer 20 may be a single layer including an oxide layer, a nitride layer, or an oxynitride layer, or a multi-layer of two or more of them.

Subsequently, first plugs 21 coupled with the drain regions 19 through the first inter-layer dielectric layer 20 and second plugs 22 coupled with the source regions 18 through the first inter-layer dielectric layer 20 are formed. The first plugs 21 and the second plugs 22 may be formed through a series of processes including forming contact holes that open the junction regions by selectively etching the first inter-layer dielectric layer 20, depositing a conductive material over the profile of the first inter-layer dielectric layer 20 to gap-fill the contact holes, and performing a planarization process until the first inter-layer dielectric layer 20 is exposed so as to isolate neighboring plugs from each other.

Herein, the size of the first plugs 21 including the line width or volume of the first plugs 21 may be the same as or greater than the second plugs 22. When the size of the first plugs 21 including the line width or volume of the first plugs 21 is greater than the second plugs 22, the operation characteristics of the semiconductor memory sensing a change in resistance may be improved. In one implementation, the first plugs 21 and the second plugs 22 may have the same height.

The first plugs 21 and the second plugs 22 may be disposed in a zigzag shape in the first direction and the second direction. For example, the first plugs 21 may be disposed to be eccentric to one side of the active regions 13 in the second direction. The second plugs 22 may be disposed to be eccentric to the other side of the active regions 13. The first plugs 21 and the second plugs 22 may be alternately disposed in the first direction or in an oblique direction at a predetermined angle from the second direction so as to form a matrix. This allows to provide a maximum space for magnetic tunnel junctions 28 which is formed to contact the first plugs 21 and the second plugs 22 in the subsequent process.

Figure 3C:
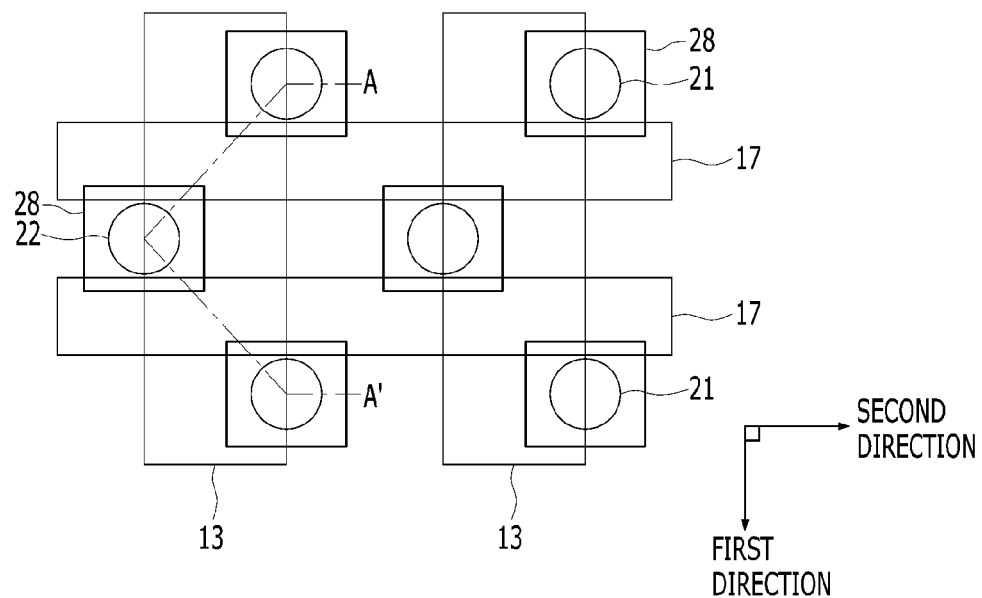
Figure 4C:
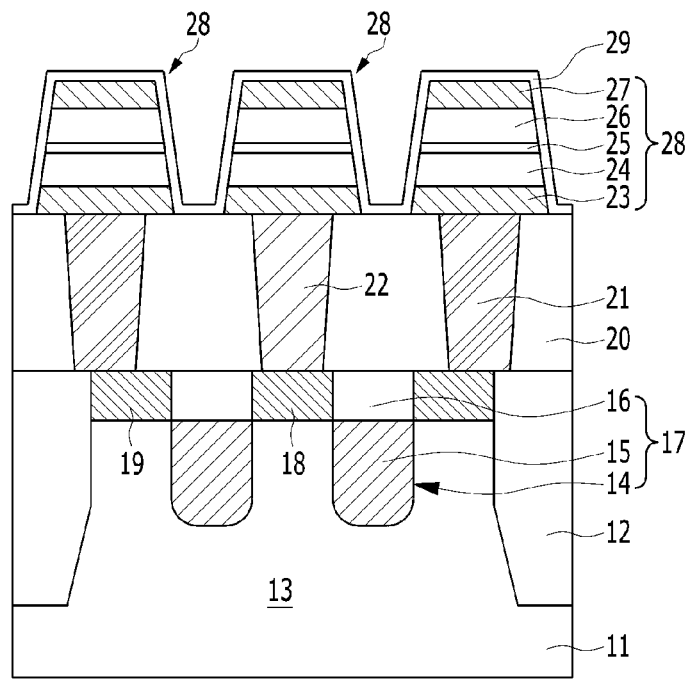

Referring to FIGS. 3C and 4C, a plurality of magnetic tunnel junctions 28 coupled with the first plugs 21 and the second plugs 22 are formed over the first inter-layer dielectric layer 20. Herein, the magnetic tunnel junctions 28 coupled with the first plugs 21 and the magnetic tunnel junctions 28 coupled with the second plugs 22 are simultaneously formed to have the same structures. Since the magnetic tunnel junctions 28 are formed on the same plane over the first inter-layer dielectric layer 20, the magnetic tunnel junctions 28 may have the same size.

Each of the magnetic tunnel junctions 28 may have a stacked structure where a bottom electrode 23, a first magnetic material 24, a tunnel barrier 25, a second magnetic material 26, and a top electrode 27 are stacked. Herein, since the magnetic tunnel junctions 28 are formed to contact the first plugs 21 and the second plugs 22, the magnetic tunnel junctions 28 may be disposed in zigzag. In other words, the magnetic tunnel junctions 28 may be formed to be disposed in the same way as the disposition of the first plugs 21 and the second plugs 22. In this way, the gap among the neighboring magnetic tunnel junctions 28 may be maximized.

The magnetic tunnel junctions 28 may be formed through a series of processes including forming a stacked layer where a conductor, a magnetic material, a dielectric material, a magnetic material, and a conductive material are stacked over the first inter-layer dielectric layer 20 and etching the stacked layer by using a mask pattern that is formed through a lithography process. Herein, by forming the magnetic tunnel junctions 28 to contact the first plugs 21 and the second plugs 22, the difficulty of the lithography process for forming the mask pattern and the number of the steps required for the lithography process can be reduced. If the magnetic tunnel junctions 28 are formed over the first plugs 21 coupled with the drain regions 19 and the magnetic tunnel junctions 28 are not formed over the second plugs 22 coupled with the source regions 18, since the gaps among the magnetic tunnel junctions 28 become different one another to have an asymmetrical form, the procedural difficulty and the number of the procedural steps of the lithography process for forming the mask pattern increase.

Subsequently, a capping layer 29 is formed over the profile of the substrate structure including the magnetic tunnel junctions 28. The capping layer 29 may be dielectric. For example, the capping layer 29 may be a single layer including an oxide layer, a nitride layer, or an oxynitride layer, or a multi-layer of two or more of them. In other implementations, the capping layer 29 may be formed in the form of spacers on the sidewalls of each of the magnetic tunnel junctions 28.

Figure 3D:
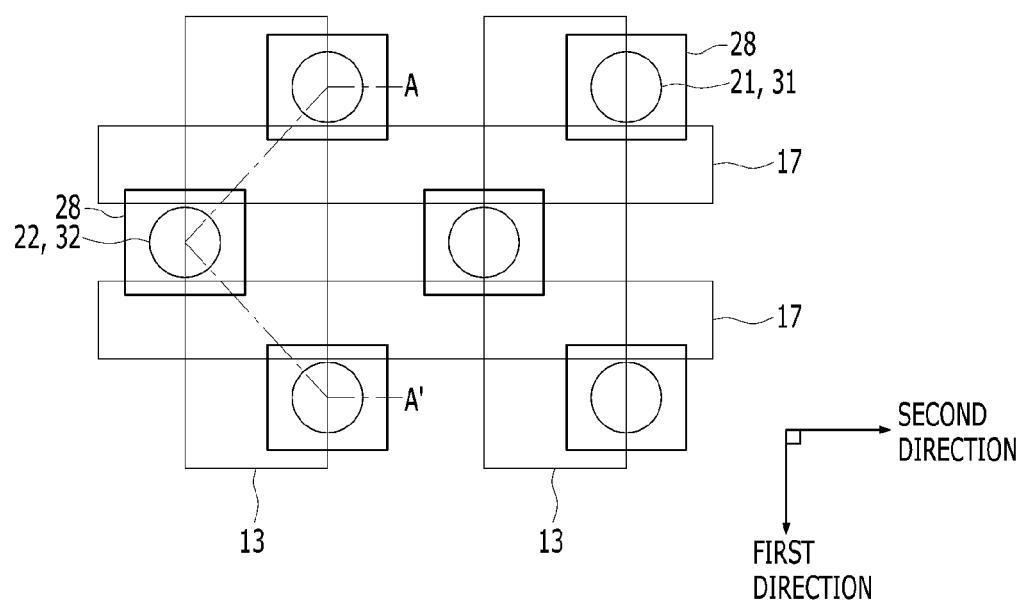
Figure 4D:
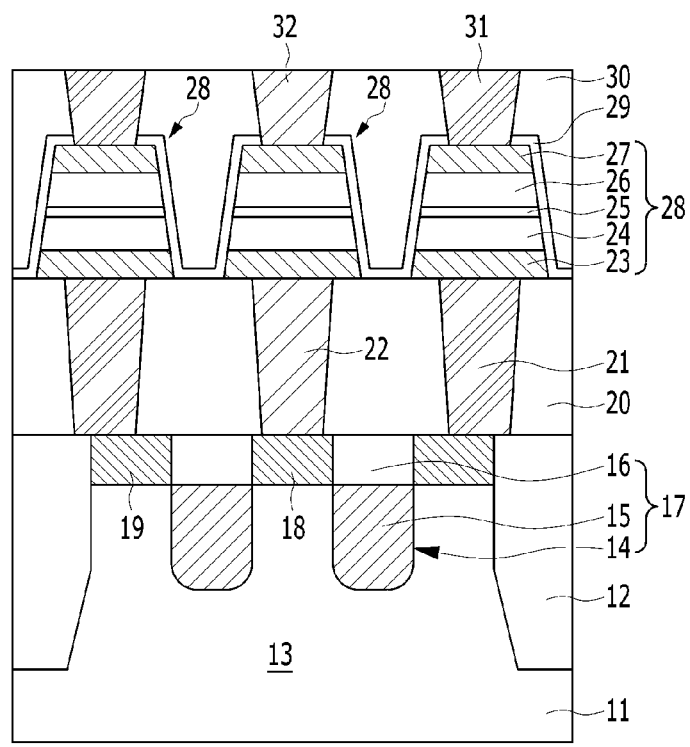

Referring to FIGS. 3D and 4D, a second inter-layer dielectric layer 30 is formed over the first inter-layer dielectric layer 20 including the magnetic tunnel junctions 28 and the capping layer 29. The second inter-layer dielectric layer 30 may be a single layer including an oxide layer, a nitride layer, or an oxynitride layer, or a multi-layer of two or more of them.

Subsequently, third plugs 31 and fourth plugs 32 that penetrate through the second inter-layer dielectric layer 30 and the capping layer 29 to contact with the magnetic tunnel junctions 28 are formed. The third plugs 31 may be formed to contact with the top electrodes 27 of the magnetic tunnel junctions 28 coupled with the first plugs 21, and the fourth plugs 32 may be formed to contact with the top electrodes 27 of the magnetic tunnel junctions 28 coupled with the second plugs 22. Therefore, the third plugs 31 and the fourth plugs 32 may have the same height (or depth).

The third plugs 31 and the fourth plugs 32 may be formed through a series of processes including forming contact holes that open the top electrodes 27 of the magnetic tunnel junctions 28 by selectively etching the second inter-layer dielectric layer 30 and the capping layer 29, depositing a conductive material over the profile of the second inter-layer dielectric layer 30 to gap-fill the contact holes, and performing a planarization process until the second inter-layer dielectric layer 30 is exposed so as to isolate neighboring plugs from each other. Herein, since both of the third plugs 31 and the fourth plugs 32 are planarized by targeting the exposure of the top electrodes 27 of the magnetic tunnel junctions 28, the magnetic tunnel junctions 28 may be protected from being damaged during the forming of the contact holes.

Herein, when the magnetic tunnel junctions 28 coupled with the second plugs 22 are not formed, the depth of the contact holes become different one another. Thus, the magnetic tunnel junctions 28 are damaged during the formation of the contact holes.

Also, the size of the third plugs 31 including the line width or volume of the third plugs 31 may be the same as or greater than the fourth plugs 32. When the size of the third plugs 31 including the line width or volume of the third plugs 31 is greater than the fourth plugs 32, the operation characteristics of the semiconductor memory sensing a change in resistance can be improved.

Figure 3E:
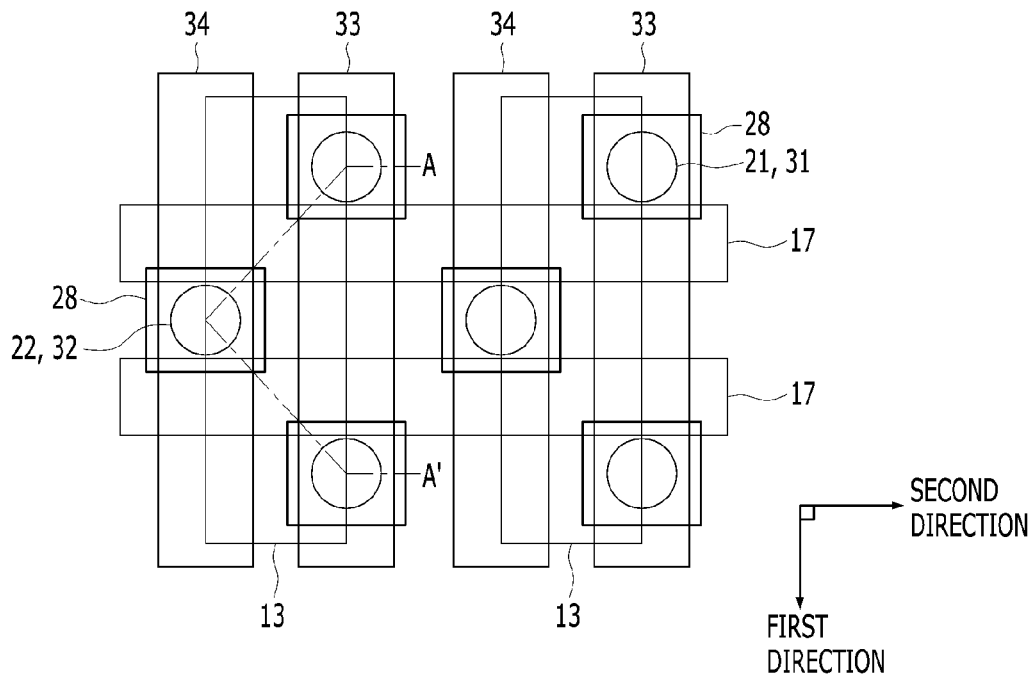
Figure 4E:
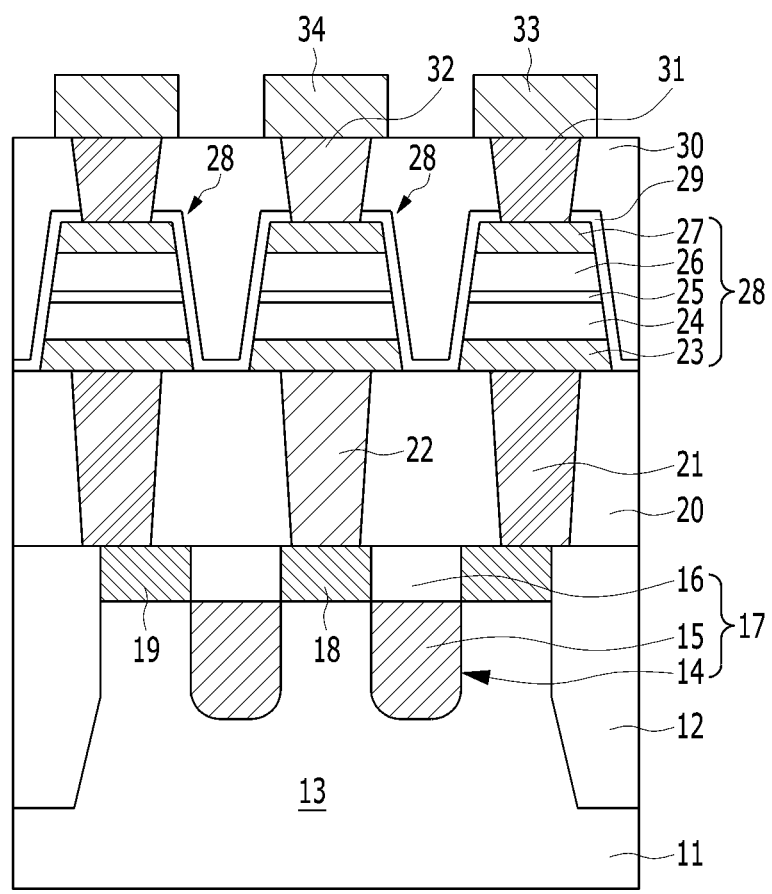

Referring to FIGS. 3E and 4E, first conductive lines 33 extended in the first direction and contacting the third plugs 31 and second conductive lines 34 extended in the first direction and contacting the fourth plugs 32 are formed over the second inter-layer dielectric layer 30. Herein, the first conductive lines 33 may be bit lines, and the second conductive lines 34 may be source lines.

A plurality of the first conductive lines 33 and a plurality of the second conductive lines 34 may be disposed to be spaced apart from each other by a predetermined gap in the second direction, and the first conductive lines 33 and the second conductive lines 34 may be alternately disposed in the second direction.

Subsequently, although not illustrated in the drawing, the fabrication of the semiconductor memory in accordance with the implementation of the patent document may be completed through known semiconductor fabrication technology.

Hereafter, a method for forming dummy magnetic tunnel junctions 28A by applying a predetermined bias and dielectrically breaking down the tunnel barrier 25 of the magnetic tunnel junctions 28 coupled with the source lines without performing an additional semiconductor fabrication process is described in detail with reference to FIGS. 3F and 4F.

Figure 3F:
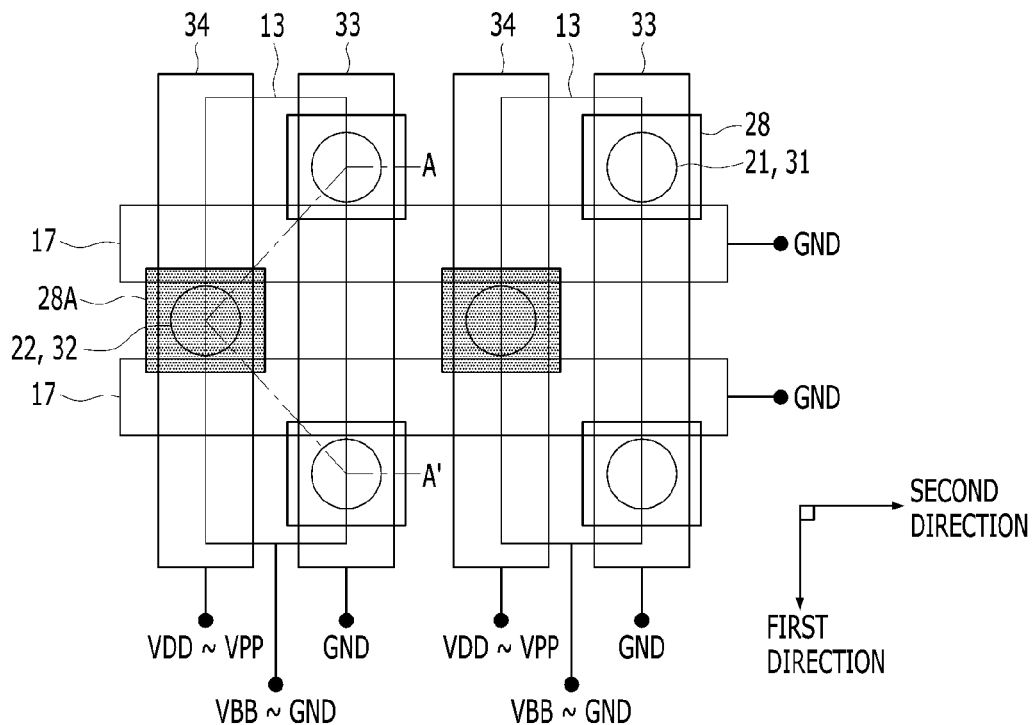
Figure 4F:
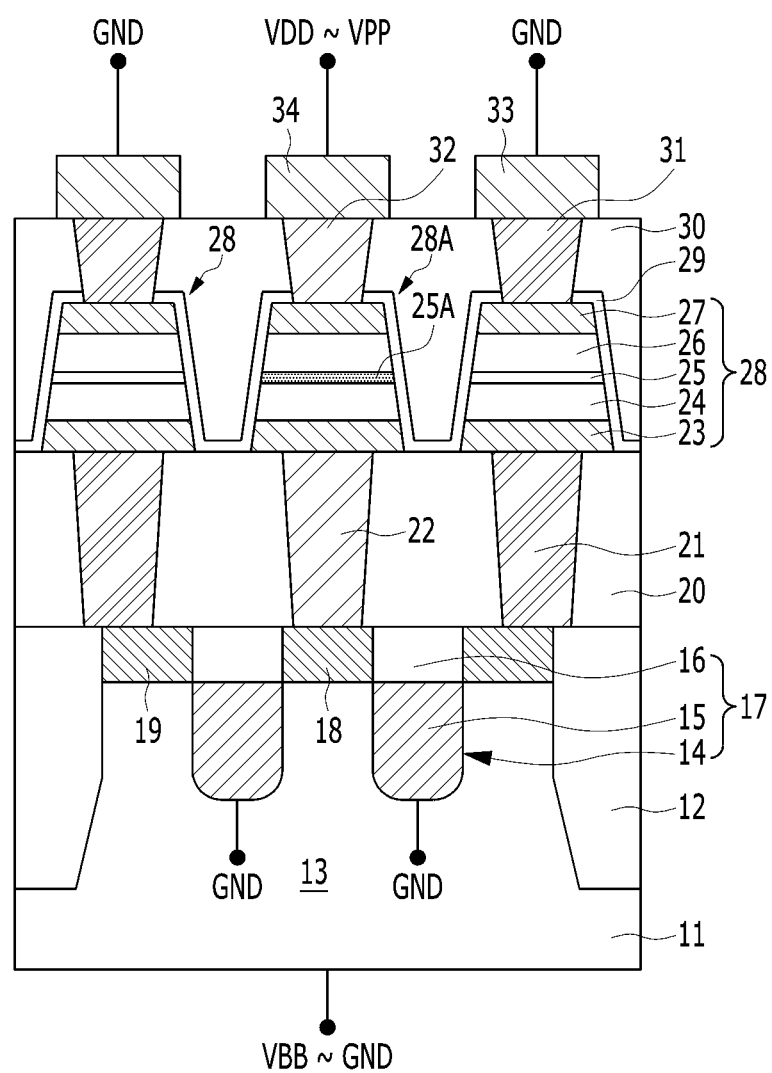

Referring to FIGS. 3F and 4F, the dummy magnetic tunnel junctions 28A are formed by applying a forming voltage to the second conductive lines 34 to cause dielectric breakdown of the tunnel barrier 25 of the magnetic tunnel junctions 28. In one implementation, the forming voltage may have a plurality of intermittent forming sections. Each of the plurality of the intermittent forming sections has a predetermined section length, or the section lengths of the intermittent forming sections gradually increase as the number of the intermittent forming sections previously included before the corresponding forming sections increases.

For example, the dummy magnetic tunnel junctions 28A may be formed by applying a first forming voltage and a second forming voltage having a potential level difference to the substrate 11 and the second conductive lines 34. The tunnel barrier 25A may be dielectrically broken down by applying the first forming voltage and the second forming voltage, which have a potential level difference from each other, to both ends of each of the magnetic tunnel junctions 28. In one implementation, a ground voltage GND may be applied to the buried gates 17 and the first conductive lines 33 that function as word lines. The first forming voltage may have a value ranging from a back bias voltage VBB to the ground voltage GND. The second forming voltage may have a value ranging from a power source voltage VDD to a pumping voltage VPP. In one implementation, the back bias voltage VBB is a negative voltage, and the power source voltage VDD and the pumping voltage VPP are positive voltages. The pumping voltage VPP is a voltage obtained by boosting the power source voltage VDD two to three times. For example, the pumping voltage VPP may be approximately 3V.

When the dummy magnetic tunnel junctions 28A are formed, the first forming voltage may be continuously applied to the substrate 11, and the second forming voltage having a plurality of intermittent forming sections may be applied to the second conductive lines 34. Each of the forming sections may have a predetermined section length, or the section length may be gradually increased as the forming sections are repeated. In one implementation, the second forming voltage have a plurality of intermittent forming sections. By doing so, it is possible to protect the neighboring structures, e.g., transistors and the magnetic tunnel junctions 28, from being damaged while the dummy magnetic tunnel junctions 28A are formed. The neighboring structures may be protected from being damaged more effectively than the case where the section length is increased as the forming sections are repeated. For example, each of the forming sections may range from approximately 0.1 second to approximately 0.3 seconds, and the first and second forming voltages may be applied for the sum of the forming sections, which ranges from approximately 5 seconds to approximately 30 seconds.

The semiconductor memory including the dummy magnetic tunnel junctions 28A may have improved stability during the processes of forming plugs and the magnetic tunnel junctions 28. Also, since the dummy magnetic tunnel junctions 28A are formed by applying a forming voltage without performing an additional semiconductor fabrication process, the magnetic tunnel junctions 28 disposed adjacent to the dummy magnetic tunnel junctions 28A can have improved stability. As a result, the reliability of the semiconductor memory may be improved.

According to an implementation of the disclosed technology, by using a dummy magnetic tunnel junction, the stability of processes for forming a plug and a magnetic tunnel junction can be improved. Also, since the dummy magnetic tunnel junction is formed by a method of applying a forming voltage without performing a separate semiconductor fabrication process, the stability can be enhanced. As a result, the reliability of a semiconductor memory can be improved.

The semiconductor memory in accordance with the implementation of the present disclosure may be applied to diverse electronic devices or systems. FIGS. 5 to 9 show some examples of electronic devices or systems that can implement the semiconductor memory disclosed herein.

Figure 5:
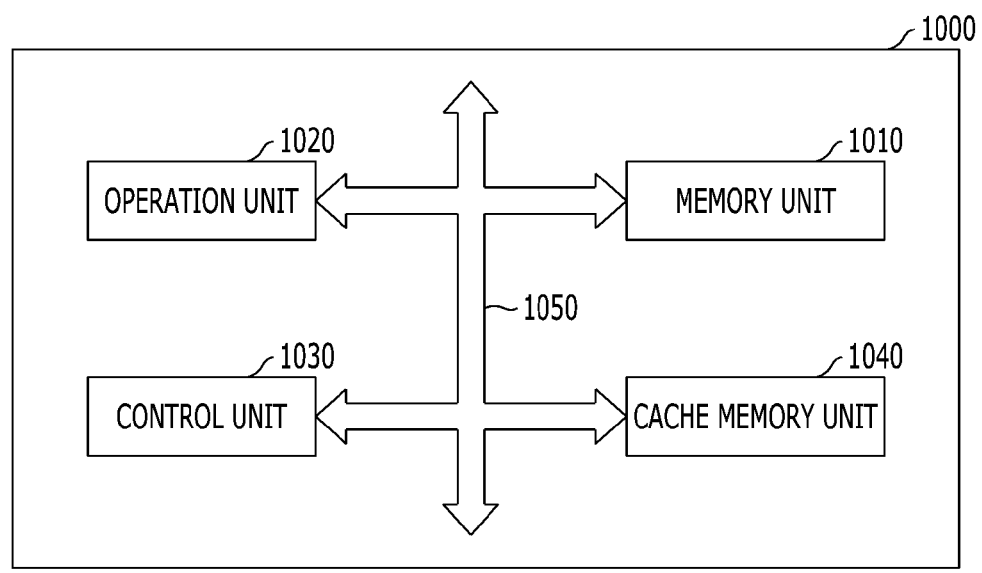
FIG. 5 is an example of configuration diagram of a microprocessor implementing memory circuitry based on the disclosed technology.

FIG. 5 is an example of configuration diagram of a microprocessor implementing memory circuitry based on the disclosed technology.

Referring to FIG. 5, a microprocessor 1000 may perform tasks for controlling and tuning a series of processes of receiving data from various external devices, processing the data, and outputting processing results to external devices. The microprocessor 1000 may include a memory unit 1010, an operation unit 1020, a control unit 1030, and so on. The microprocessor 1000 may be various data processing units such as a central processing unit (CPU), a graphic processing unit (GPU), a digital signal processor (DSP) and an application processor (AP).

The memory unit 1010 is a part which stores data in the microprocessor 1000, as a processor register, register or the like. The memory unit 1010 may include a data register, an address register, a floating point register and so on. Besides, the memory unit 1010 may include various registers. The memory unit 1010 may perform the function of temporarily storing data for which operations are to be performed by the operation unit 1020, result data of performing the operations and addresses where data for performing of the operations are stored.

The memory unit 1010 may include one or more of the above-described semiconductor devices in accordance with the implementations. the memory unit 1010 may include a selection element; a first plug and a second plug that are coupled with two different sides of the selection element, respectively; a variable resistance element formed over the first plug and configured to store data; and a dummy variable resistance element formed over the second plug and configured to include a conductive path coupled with the second plug, wherein the variable resistance element and the dummy variable resistance element may include a magnetic tunnel junction in which a tunnel barrier is interposed between two magnetic materials, and the tunnel barrier of the dummy magnetic tunnel junction is dielectrically broken down. Through this, the memory unit 1010 and the microprocessor 1000 may have improved reliability.

The operation unit 1020 may perform four arithmetical operations or logical operations according to results that the control unit 1030 decodes commands. The operation unit 1020 may include at least one arithmetic logic unit (ALU) and so on.

The control unit 1030 may receive signals from the memory unit 1010, the operation unit 1020 and an external device of the microprocessor 1000, perform extraction, decoding of commands, and controlling input and output of signals of the microprocessor 1000, and execute processing represented by programs.

The microprocessor 1000 according to the present implementation may additionally include a cache memory unit 1040 which can temporarily store data to be inputted from an external device other than the memory unit 1010 or to be outputted to an external device. In this case, the cache memory unit 1040 may exchange data with the memory unit 1010, the operation unit 1020 and the control unit 1030 through a bus interface 1050.

Figure 6:
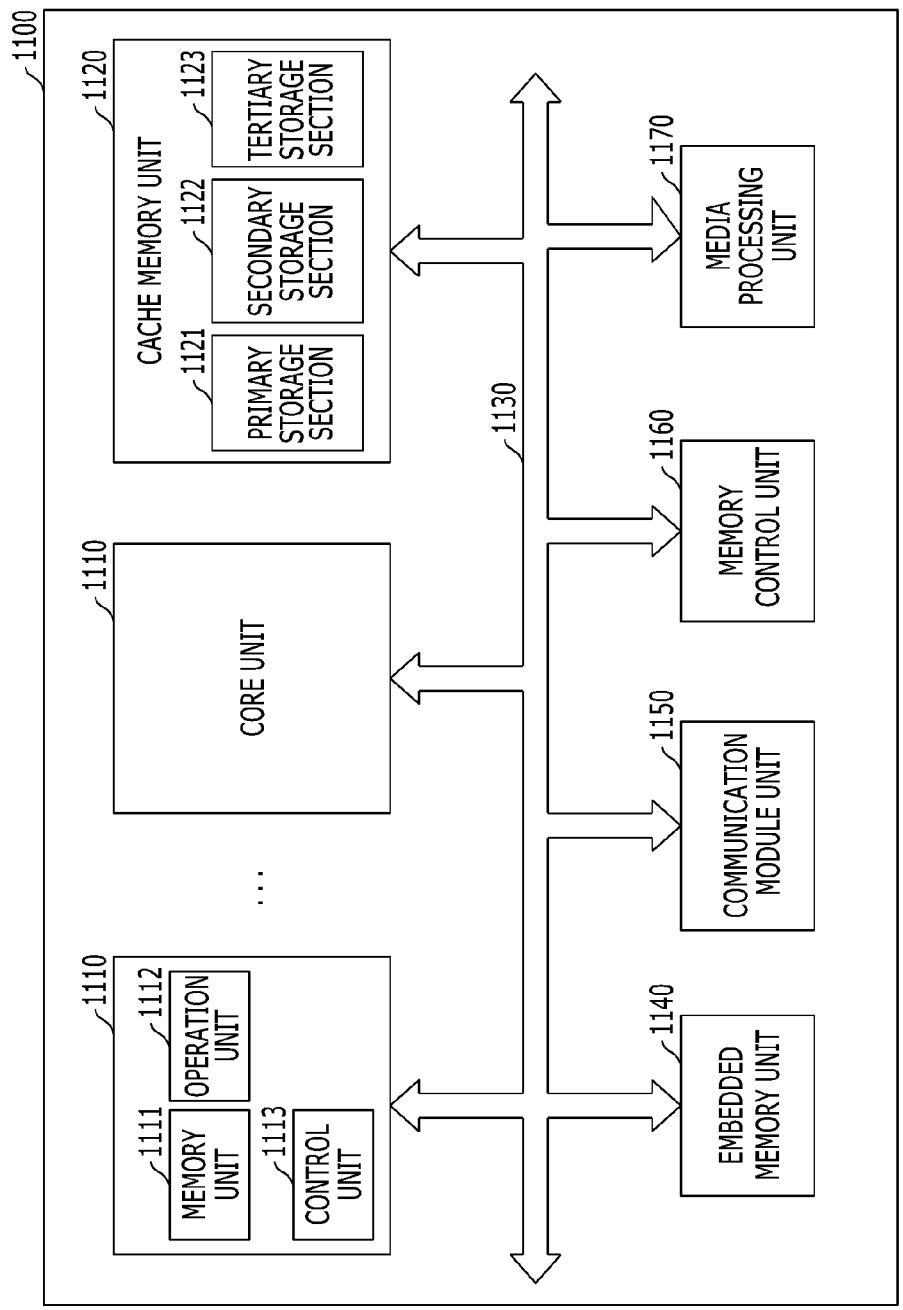
FIG. 6 is an example of configuration diagram of a processor implementing memory circuitry based on the disclosed technology.

FIG. 6 is an example of configuration diagram of a processor implementing memory circuitry based on the disclosed technology.

Referring to FIG. 6, a processor 1100 may improve performance and realize multi-functionality by including various functions other than those of a microprocessor which performs tasks for controlling and tuning a series of processes of receiving data from various external devices, processing the data, and outputting processing results to external devices. The processor 1100 may include a core unit 1110 which serves as the microprocessor, a cache memory unit 1120 which serves to storing data temporarily, and a bus interface 1130 for transferring data between internal and external devices. The processor 1100 may include various system-on-chips (SoCs) such as a multi-core processor, a graphic processing unit (GPU) and an application processor (AP).

The core unit 1110 of the present implementation is a part which performs arithmetic logic operations for data inputted from an external device, and may include a memory unit 1111, an operation unit 1112 and a control unit 1113.

The memory unit 1111 is a part which stores data in the processor 1100, as a processor register, a register or the like. The memory unit 1111 may include a data register, an address register, a floating point register and so on. Besides, the memory unit 1111 may include various registers. The memory unit 1111 may perform the function of temporarily storing data for which operations are to be performed by the operation unit 1112, result data of performing the operations and addresses where data for performing of the operations are stored. The operation unit 1112 is a part which performs operations in the processor 1100. The operation unit 1112 may perform four arithmetical operations, logical operations, according to results that the control unit 1113 decodes commands, or the like. The operation unit 1112 may include at least one arithmetic logic unit (ALU) and so on. The control unit 1113 may receive signals from the memory unit 1111, the operation unit 1112 and an external device of the processor 1100, perform extraction, decoding of commands, controlling input and output of signals of processor 1100, and execute processing represented by programs.

The cache memory unit 1120 is a part which temporarily stores data to compensate for a difference in data processing speed between the core unit 1110 operating at a high speed and an external device operating at a low speed. The cache memory unit 1120 may include a primary storage section 1121, a secondary storage section 1122 and a tertiary storage section 1123. In general, the cache memory unit 1120 includes the primary and secondary storage sections 1121 and 1122, and may include the tertiary storage section 1123 in the case where high storage capacity is required. As the occasion demands, the cache memory unit 1120 may include an increased number of storage sections. That is to say, the number of storage sections which are included in the cache memory unit 1120 may be changed according to a design. The speeds at which the primary, secondary and tertiary storage sections 1121, 1122 and 1123 store and discriminate data may be the same or different. In the case where the speeds of the respective storage sections 1121, 1122 and 1123 are different, the speed of the primary storage section 1121 may be largest. At least one storage section of the primary storage section 1121, the secondary storage section 1122 and the tertiary storage section 1123 of the cache memory unit 1120 may include one or more of the above-described semiconductor devices in accordance with the implementations. For example, the cache memory unit 1120 may include a selection element; a first plug and a second plug that are coupled with two different sides of the selection element, respectively; a variable resistance element formed over the first plug and configured to store data; and a dummy variable resistance element formed over the second plug and configured to include a conductive path coupled with the second plug, wherein the variable resistance element and the dummy variable resistance element may include a magnetic tunnel junction in which a tunnel barrier is interposed between two magnetic materials, and the tunnel barrier of the dummy magnetic tunnel junction is dielectrically broken down. Through this, the cache memory unit 1120 and the processor 1100 may have improved reliability.

Although it was shown in FIG. 6 that all the primary, secondary and tertiary storage sections 1121, 1122 and 1123 are configured inside the cache memory unit 1120, it is to be noted that all the primary, secondary and tertiary storage sections 1121, 1122 and 1123 of the cache memory unit 1120 may be configured outside the core unit 1110 and may compensate for a difference in data processing speed between the core unit 1110 and the external device. Meanwhile, it is to be noted that the primary storage section 1121 of the cache memory unit 1120 may be disposed inside the core unit 1110 and the secondary storage section 1122 and the tertiary storage section 1123 may be configured outside the core unit 1110 to strengthen the function of compensating for a difference in data processing speed. In another implementation, the primary and secondary storage sections 1121, 1122 may be disposed inside the core units 1110 and tertiary storage sections 1123 may be disposed outside core units 1110.

The bus interface 1130 is a part which connects the core unit 1110, the cache memory unit 1120 and external device and allows data to be efficiently transmitted.

The processor 1100 according to the present implementation may include a plurality of core units 1110, and the plurality of core units 1110 may share the cache memory unit 1120. The plurality of core units 1110 and the cache memory unit 1120 may be directly connected or be connected through the bus interface 1130. The plurality of core units 1110 may be configured in the same way as the above-described configuration of the core unit 1110. In the case where the processor 1100 includes the plurality of core unit 1110, the primary storage section 1121 of the cache memory unit 1120 may be configured in each core unit 1110 in correspondence to the number of the plurality of core units 1110, and the secondary storage section 1122 and the tertiary storage section 1123 may be configured outside the plurality of core units 1110 in such a way as to be shared through the bus interface 1130. The processing speed of the primary storage section 1121 may be larger than the processing speeds of the secondary and tertiary storage section 1122 and 1123. In another implementation, the primary storage section 1121 and the secondary storage section 1122 may be configured in each core unit 1110 in correspondence to the number of the plurality of core units 1110, and the tertiary storage section 1123 may be configured outside the plurality of core units 1110 in such a way as to be shared through the bus interface 1130.

The processor 1100 according to the present implementation may further include an embedded memory unit 1140 which stores data, a communication module unit 1150 which can transmit and receive data to and from an external device in a wired or wireless manner, a memory control unit 1160 which drives an external memory device, and a media processing unit 1170 which processes the data processed in the processor 1100 or the data inputted from an external input device and outputs the processed data to an external interface device and so on. Besides, the processor 1100 may include a plurality of various modules and devices. In this case, the plurality of modules which are added may exchange data with the core units 1110 and the cache memory unit 1120 and with one another, through the bus interface 1130.

The embedded memory unit 1140 may include not only a volatile memory but also a nonvolatile memory. The volatile memory may include a DRAM (dynamic random access memory), a mobile DRAM, an SRAM (static random access memory), and a memory with similar functions to above mentioned memories, and so on. The nonvolatile memory may include a ROM (read only memory), a NOR flash memory, a NAND flash memory, a phase change random access memory (PRAM), a resistive random access memory (RRAM), a spin transfer torque random access memory (STTRAM), a magnetic random access memory (MRAM), a memory with similar functions.

The communication module unit 1150 may include a module capable of being connected with a wired network, a module capable of being connected with a wireless network and both of them. The wired network module may include a local area network (LAN), a universal serial bus (USB), an Ethernet, power line communication (PLC) such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB) such as various devices which send and receive data without transmit lines, and so on.

The memory control unit 1160 is to administrate and process data transmitted between the processor 1100 and an external storage device operating according to a different communication standard. The memory control unit 1160 may include various memory controllers, for example, devices which may control IDE (Integrated Device Electronics), SATA (Serial Advanced Technology Attachment), SCSI (Small Computer System Interface), RAID (Redundant Array of Independent Disks), an SSD (solid state disk), eSATA (External SATA), PCMCIA (Personal Computer Memory Card International Association), a USB (universal serial bus), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The media processing unit 1170 may process the data processed in the processor 1100 or the data inputted in the forms of image, voice and others from the external input device and output the data to the external interface device. The media processing unit 1170 may include a graphic processing unit (GPU), a digital signal processor (DSP), a high definition audio device (HD audio), a high definition multimedia interface (HDMI) controller, and so on.

Figure 7:
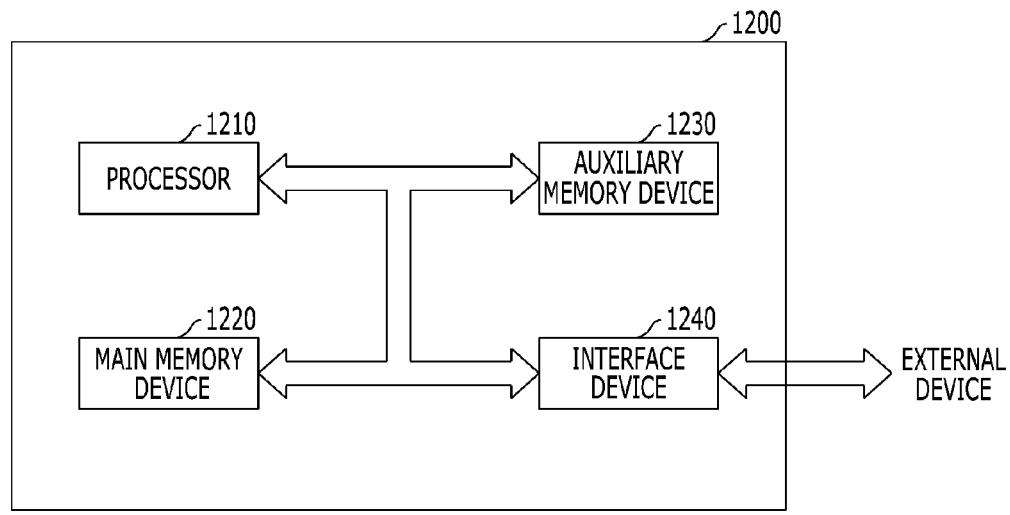
FIG. 7 is an example of configuration diagram of a system implementing memory circuitry based on the disclosed technology.

FIG. 7 is an example of configuration diagram of a system implementing memory circuitry based on the disclosed technology.

Referring to FIG. 7, a system 1200 as an apparatus for processing data may perform input, processing, output, communication, storage, etc. to conduct a series of manipulations for data. The system 1200 may include a processor 1210, a main memory device 1220, an auxiliary memory device 1230, an interface device 1240, and so on. The system 1200 of the present implementation may be various electronic systems which operate using processors, such as a computer, a server, a PDA (personal digital assistant), a portable computer, a web tablet, a wireless phone, a mobile phone, a smart phone, a digital music player, a PMP (portable multimedia player), a camera, a global positioning system (GPS), a video camera, a voice recorder, a telematics, an audio visual (AV) system, a smart television, and so on.

The processor 1210 may decode inputted commands and processes operation, comparison, etc. for the data stored in the system 1200, and controls these operations. The processor 1210 may include a microprocessor unit (MPU), a central processing unit (CPU), a single/multi-core processor, a graphic processing unit (GPU), an application processor (AP), a digital signal processor (DSP), and so on.

The main memory device 1220 is a storage which can temporarily store, call and execute program codes or data from the auxiliary memory device 1230 when programs are executed and can conserve memorized contents even when power supply is cut off. The main memory device 1220 may include one or more of the above-described semiconductor devices in accordance with the implementations. For example, the main memory device 1220 may include a selection element; a first plug and a second plug that are coupled with two different sides of the selection element, respectively; a variable resistance element formed over the first plug and configured to store data; and a dummy variable resistance element formed over the second plug and configured to include a conductive path coupled with the second plug, wherein the variable resistance element and the dummy variable resistance element may include a magnetic tunnel junction in which a tunnel barrier is interposed between two magnetic materials, and the tunnel barrier of the dummy magnetic tunnel junction is dielectrically broken down. Through this, the main memory device 1220 and the system 1200 may have improved reliability.

Also, the main memory device 1220 may further include a static random access memory (SRAM), a dynamic random access memory (DRAM), and so on, of a volatile memory type in which all contents are erased when power supply is cut off. Unlike this, the main memory device 1220 may not include the semiconductor devices according to the implementations, but may include a static random access memory (SRAM), a dynamic random access memory (DRAM), and so on, of a volatile memory type in which all contents are erased when power supply is cut off.

The auxiliary memory device 1230 is a memory device for storing program codes or data. While the speed of the auxiliary memory device 1230 is slower than the main memory device 1220, the auxiliary memory device 1230 can store a larger amount of data. The auxiliary memory device 1230 may include one or more of the above-described semiconductor devices in accordance with the implementations. For example, the auxiliary memory device 1230 may include a selection element; a first plug and a second plug that are coupled with two different sides of the selection element, respectively; a variable resistance element formed over the first plug and configured to store data; and a dummy variable resistance element formed over the second plug and configured to include a conductive path coupled with the second plug, wherein the variable resistance element and the dummy variable resistance element may include a magnetic tunnel junction in which a tunnel barrier is interposed between two magnetic materials, and the tunnel barrier of the dummy magnetic tunnel junction is dielectrically broken down. Through this, the auxiliary memory device 1230 and the system 1200 may have improved reliability.

Also, the auxiliary memory device 1230 may further include a data storage system (see the reference numeral 1300 of FIG. 8) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on. Unlike this, the auxiliary memory device 1230 may not include the semiconductor devices according to the implementations, but may include data storage systems (see the reference numeral 1300 of FIG. 8) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The interface device 1240 may be to perform exchange of commands and data between the system 1200 of the present implementation and an external device. The interface device 1240 may be a keypad, a keyboard, a mouse, a speaker, a mike, a display, various human interface devices (HIDs), a communication device, and so on. The communication device may include a module capable of being connected with a wired network, a module capable of being connected with a wireless network and both of them. The wired network module may include a local area network (LAN), a universal serial bus (USB), an Ethernet, power line communication (PLC), such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB), such as various devices which send and receive data without transmit lines, and so on.

Figure 8:
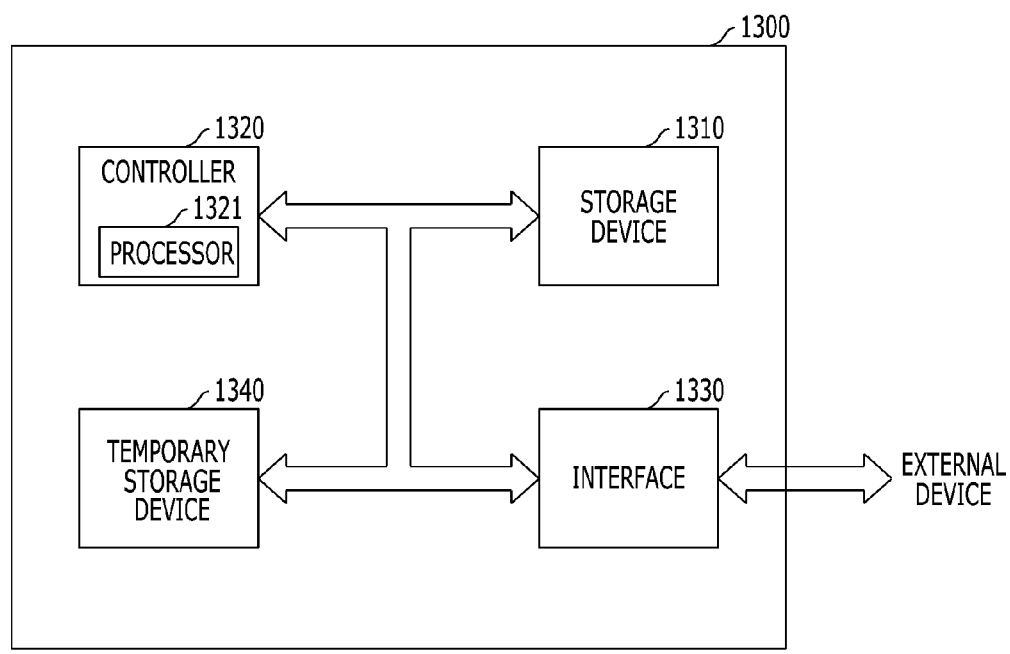
FIG. 8 is an example of configuration diagram of a data storage system implementing memory circuitry based on the disclosed technology.

FIG. 8 is an example of configuration diagram of a data storage system implementing memory circuitry based on the disclosed technology.

Referring to FIG. 8, a data storage system 1300 may include a storage device 1310 which has a nonvolatile characteristic as a component for storing data, a controller 1320 which controls the storage device 1310, an interface 1330 for connection with an external device, and a temporary storage device 1340 for storing data temporarily. The data storage system 1300 may be a disk type such as a hard disk drive (HDD), a compact disc read only memory (CDROM), a digital versatile disc (DVD), a solid state disk (SSD), and so on, and a card type such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The storage device 1310 may include a nonvolatile memory which stores data semi-permanently. The nonvolatile memory may include a ROM (read only memory), a NOR flash memory, a NAND flash memory, a phase change random access memory (PRAM), a resistive random access memory (RRAM), a magnetic random access memory (MRAM), and so on.

The controller 1320 may control exchange of data between the storage device 1310 and the interface 1330. To this end, the controller 1320 may include a processor 1321 for performing an operation for, processing commands inputted through the interface 1330 from an outside of the data storage system 1300 and so on.

The interface 1330 is to perform exchange of commands and data between the data storage system 1300 and the external device. In the case where the data storage system 1300 is a card type, the interface 1330 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. In the case where the data storage system 1300 is a disk type, the interface 1330 may be compatible with interfaces, such as IDE (Integrated Device Electronics), SATA (Serial Advanced Technology Attachment), SCSI (Small Computer System Interface), eSATA (External SATA), PCMCIA (Personal Computer Memory Card International Association), a USB (universal serial bus), and so on, or be compatible with the interfaces which are similar to the above mentioned interfaces. The interface 1330 may be compatible with one or more interfaces having a different type from each other.

The temporary storage device 1340 can store data temporarily for efficiently transferring data between the interface 1330 and the storage device 1310 according to diversifications and high performance of an interface with an external device, a controller and a system. The temporary storage device 1340 for temporarily storing data may include one or more of the above-described semiconductor devices in accordance with the implementations. For example, the temporary storage device 1340 may include a selection element; a first plug and a second plug that are coupled with two different sides of the selection element, respectively; a variable resistance element formed over the first plug and configured to store data; and a dummy variable resistance element formed over the second plug and configured to include a conductive path coupled with the second plug, wherein the variable resistance element and the dummy variable resistance element may include a magnetic tunnel junction in which a tunnel barrier is interposed between two magnetic materials, and the tunnel barrier of the dummy magnetic tunnel junction is dielectrically broken down. Through this, the temporary storage device 1340 and the data storage system 1300 may have improved reliability.

Figure 9:
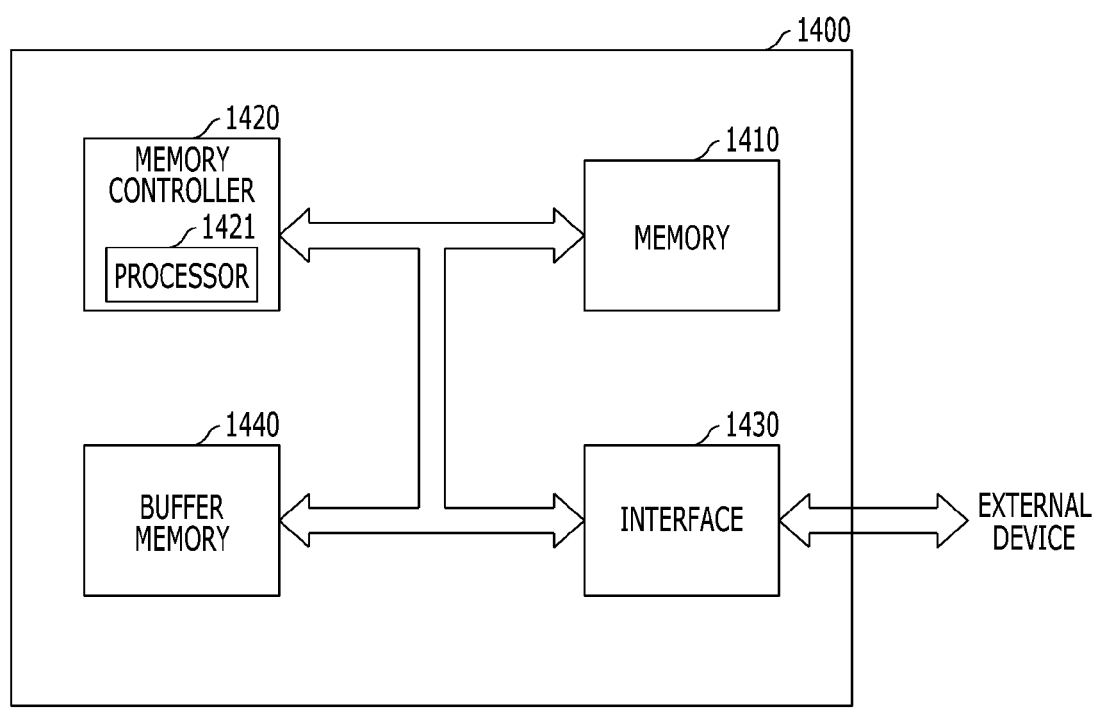
FIG. 9 is an example of configuration diagram of a memory system implementing memory circuitry based on the disclosed technology.

FIG. 9 is an example of configuration diagram of a memory system implementing memory circuitry based on the disclosed technology.

Referring to FIG. 9, a memory system 1400 may include a memory 1410 which has a nonvolatile characteristic as a component for storing data, a memory controller 1420 which controls the memory 1410, an interface 1430 for connection with an external device, and so on. The memory system 1400 may be a card type such as a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The memory 1410 for storing data may include one or more of the above-described semiconductor devices in accordance with the implementations. For example, the memory 1410 may include a selection element; a first plug and a second plug that are coupled with two different sides of the selection element, respectively; a variable resistance element formed over the first plug and configured to store data; and a dummy variable resistance element formed over the second plug and configured to include a conductive path coupled with the second plug, wherein the variable resistance element and the dummy variable resistance element may include a magnetic tunnel junction in which a tunnel barrier is interposed between two magnetic materials, and the tunnel barrier of the dummy magnetic tunnel junction is dielectrically broken down. Through this, the memory 1410 and the memory system 1400 may have improved reliability.

Also, the memory 1410 according to the present implementation may further include a ROM (read only memory), a NOR flash memory, a NAND flash memory, a phase change random access memory (PRAM), a resistive random access memory (RRAM), a magnetic random access memory (MRAM), and so on, which have a nonvolatile characteristic.

The memory controller 1420 may control exchange of data between the memory 1410 and the interface 1430. To this end, the memory controller 1420 may include a processor 1421 for performing an operation for and processing commands inputted through the interface 1430 from an outside of the memory system 1400.

The interface 1430 is to perform exchange of commands and data between the memory system 1400 and the external device. The interface 1430 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. The interface 1430 may be compatible with one or more interfaces having a different type from each other.

The memory system 1400 according to the present implementation may further include a buffer memory 1440 for efficiently transferring data between the interface 1430 and the memory 1410 according to diversification and high performance of an interface with an external device, a memory controller and a memory system. For example, the buffer memory 1440 may include a selection element; a first plug and a second plug that are coupled with two different sides of the selection element, respectively; a variable resistance element formed over the first plug and configured to store data; and a dummy variable resistance element formed over the second plug and configured to include a conductive path coupled with the second plug, wherein the variable resistance element and the dummy variable resistance element may include a magnetic tunnel junction in which a tunnel barrier is interposed between two magnetic materials, and the tunnel barrier of the dummy magnetic tunnel junction is dielectrically broken down. Through this, the buffer memory 1440 and the memory system 1400 may have improved reliability.

Moreover, the buffer memory 1440 according to the present implementation may further include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic. Unlike this, the buffer memory 1440 may not include the semiconductor devices according to the implementations, but may include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic.

Features in the above examples of electronic devices or systems in FIGS. 5 to 9 based on the memory devices disclosed in this document may be implemented in various devices, systems or applications. Some examples include mobile phones or other portable communication devices, tablet computers, notebook or laptop computers, game machines, smart TV sets, TV set top boxes, multimedia servers, digital cameras with or without wireless communication functions, wrist watches or other wearable devices with wireless communication capabilities.

While this present document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve described results. Moreover, the separation of various system components in the embodiments described in this patent document should not be understood as requiring such separation in all embodiments. Only a few implementations and examples are described. Other implementations, enhancements and variations can be made based on what is described and illustrated in this patent document.

What is claimed is:

1. An electronic device comprising a semiconductor memory that comprises:
   a selection element;
   a first plug and a second plug that are coupled with two different sides of the selection element, respectively;
   a variable resistance element formed over the first plug and configured to store data; and
   a dummy variable resistance element formed over the second plug and configured to include a conductive path coupled with the second plug;
   wherein the variable resistance element includes a magnetic tunnel junction that includes two magnetic layers separated by a barrier layer to allow for tunneling of electrons and is capable of exhibiting different resistance states for storing different data and the dummy variable resistance element is a dummy magnetic tunnel junction that includes two magnetic layers that is separated from each other but is connected by the conductive path and is incapable of exhibiting different resistance states for storing different data.

2. The electronic device according to claim 1, wherein a line width or volume of the first plug is the same as or greater than a line width or volume of the second plug.

3. The electronic device according to claim 1, wherein the first plug and the second plug have the same height.

4. The electronic device according to claim 1, wherein the magnetic tunnel junction and the dummy magnetic tunnel junction are formed on the same plane and have the same size.

5. The electronic device according to claim 1, wherein the dummy magnetic tunnel junction includes a tunnel barrier layer between the magnetic layers initially during fabrication that is dielectrically broken down upon completion of the fabrication to form the conductive path.

6. The electronic device according to claim 1, wherein the variable resistance element includes a metal oxide dielectric material, a phase-change dielectric material, or a ferroelectric dielectric material, and
   the dummy variable resistance element includes a metal oxide dielectric material, a phase-change dielectric material, or a ferroelectric dielectric material that is dielectrically broken down upon completion of the fabrication to form the conductive path.

7. The electronic device according to claim 1, wherein the semiconductor memory further comprises:
   a third plug formed over the variable resistance element;
   a fourth plug formed over the dummy variable resistance element and coupled with the conductive path;
   a first conductive line coupled with the third plug; and
   a second conductive line coupled with the fourth plug.

8. The electronic device according to claim 7, wherein a line width or volume of the third plug is the same as or greater than a line width or volume of the fourth plug.

9. The electronic device according to claim 7, wherein the third plug and the fourth plug have the same height.

10. The electronic device according to claim 1, further comprising a microprocessor which includes:
    a control unit configured to receive a signal including a command from an outside of the microprocessor, and performs extracting, decoding of the command, or controlling input or output of a signal of the microprocessor;
    an operation unit configured to perform an operation based on a result that the control unit decodes the command; and
    a memory unit configured to store data for performing the operation, data corresponding to a result of performing the operation, or an address of data for which the operation is performed,
    wherein the semiconductor memory is part of the memory unit in the microprocessor.

11. The electronic device according to claim 1, further comprising a processor which includes:
    a core unit configured to perform, based on a command inputted from an outside of the processor, an operation corresponding to the command, by using data;
    a cache memory unit configured to store data for performing the operation, data corresponding to a result of performing the operation, or an address of data for which the operation is performed; and
    a bus interface connected between the core unit and the cache memory unit, and configured to transmit data between the core unit and the cache memory unit,
    wherein the semiconductor memory is part of the cache memory unit in the processor.

12. The electronic device according to claim 1, further comprising a processing system which includes:
    a processor configured to decode a command received by the processor and control an operation for information based on a result of decoding the command;
    an auxiliary memory device configured to store a program for decoding the command and the information;
    a main memory device configured to call and store the program and the information from the auxiliary memory device such that the processor can perform the operation using the program and the information when executing the program; and
    an interface device configured to perform communication between at least one of the processor, the auxiliary memory device and the main memory device and the outside,
    wherein the semiconductor memory is part of the auxiliary memory device or the main memory device in the processing system.

13. The electronic device according to claim 1, further comprising a data storage system which includes:
    a storage device configured to store data and conserve stored data regardless of power supply;

a controller configured to control input and output of data to and from the storage device according to a command inputted form an outside;

a temporary storage device configured to temporarily store data exchanged between the storage device and the outside; and an interface configured to perform communication between at least one of the storage device, the controller and the temporary storage device and the outside, wherein the semiconductor memory is part of the storage device or the temporary storage device in the data storage system.

14. The electronic device according to claim 1, further comprising a memory system which includes:

a memory configured to store data and conserve stored data regardless of power supply;

a memory controller configured to control input and output of data to and from the memory according to a command inputted form an outside;

a buffer memory configured to buffer data exchanged between the memory and the outside; and an interface configured to perform communication between at least one of the memory, the memory controller and the buffer memory and the outside, wherein the semiconductor memory is part of the memory or the buffer memory in the memory system.

15. An electronic device comprising a semiconductor memory that comprises:

a substrate;

memory cells formed over the substrate as a memory cell array for storing data; and selection elements coupled to the memory cells, respectively, each selection element operable to turn on or off a corresponding coupled memory cell;

wherein each memory cell includes a variable resistance element formed over the substrate to exhibit different resistance states that represent different digital bits for storing different data;

a dummy variable resistance element formed over the substrate to have a similar structure as the variable resistance element and located adjacent to the variable resistance element, the dummy variable resistance including a conductive path passing through the dummy variable resistance element and does not exhibit different resistance states;

first and second plugs formed over the substrate and respectively coupled to the variable resistance element and the dummy variable resistance element, respectively; and a selection element formed over the substrate and having two terminals coupled to the first and second plugs, respectively, the selection element operable to switch on or off a variable resistance element inside a corresponding memory cell, wherein the variable resistance element includes a magnetic tunnel junction that includes two magnetic layers separated by a barrier layer to allow for tunneling of electrons and is capable of exhibiting the different resistance states for storing different data and the dummy variable resistance element is a dummy magnetic tunnel junction that includes two magnetic layers that is separated from each other but is connected by the conductive path and is incapable of exhibiting different resistance states for storing different data.

16. The electronic device according to claim 15, wherein a line width or volume of the first plug is the same as or greater than a line width or volume of the second plug.

17. The electronic device according to claim 15, wherein the first plug and the second plug have the same height and are in a common layer above the substrate.

18. The electronic device according to claim 15, wherein the dummy magnetic tunnel junction includes a tunnel barrier layer between the magnetic layers initially during fabrication that is dielectrically broken down upon completion of the fabrication to form the conductive path.

19. The electronic device according to claim 15, wherein:

the variable resistance element includes a metal oxide dielectric material, a phase-change dielectric material, or a ferroelectric dielectric material to exhibit the different resistance states, and the dummy variable resistance element includes a metal oxide dielectric material, a phase-change dielectric material, or a ferroelectric dielectric material that is dielectrically broken down upon completion of the fabrication to form the conductive path.

* * * * *